(12) United States Patent
Nishizawa

(10) Patent No.: US 7,839,651 B2
(45) Date of Patent: Nov. 23, 2010

(54) MULTILAYER CERAMIC ELECTRONIC COMPONENT

(75) Inventor: Yoshihiko Nishizawa, Kyoto (JP)

(73) Assignee: Murata Manufacturing Co., Ltd., Nagaokakyo-shi, Kyoto-fu (JP)

(*) Notice: Subject to any disclaimer, the term of this patent is extended or adjusted under 35 U.S.C. 154(b) by 0 days.

(21) Appl. No.: 12/269,128

(22) Filed: Nov. 12, 2008

(65) Prior Publication Data

US 2009/0068426 A1    Mar. 12, 2009

Related U.S. Application Data

(63) Continuation of application No. PCT/JP2007/061774, filed on Jun. 12, 2007.

(30) Foreign Application Priority Data

Jun. 14, 2006    (JP) .............................. 2006-164195

(51) Int. Cl.
*H05K 1/18*    (2006.01)
(52) U.S. Cl. .................. 361/763; 361/761; 361/784
(58) Field of Classification Search ......... 361/760–763, 361/780–784; 257/700–723
See application file for complete search history.

(56) References Cited

U.S. PATENT DOCUMENTS

| 5,476,728 A | 12/1995 | Nakano et al. |
| 6,426,551 B1 * | 7/2002 | Kawakami et al. ........... 257/700 |
| 6,515,568 B1 | 2/2003 | Maki et al. |
| 7,232,557 B2 * | 6/2007 | Duan et al. ............... 423/594.1 |

FOREIGN PATENT DOCUMENTS

| JP | 07-201566 A | 8/1995 |
| JP | 2002-118033 A | 4/2002 |
| JP | 2004-235494 A | 8/2004 |
| JP | 2005-183890 A | 7/2005 |

OTHER PUBLICATIONS

Official Communication issued in International Patent Application No. PCT/JP2007/061774, mailed on Sep. 25, 2007.

* cited by examiner

*Primary Examiner*—Tuan T Dinh
(74) *Attorney, Agent, or Firm*—Dickstein Shapiro LLP

(57) ABSTRACT

In a multilayer ceramic electronic component, a ceramic laminate is defined by a ceramic base layer and ceramic auxiliary layers arranged on both main surfaces of the ceramic base layer, the ceramic base layer and the ceramic auxiliary layers being co-fired. The ceramic base layer and the ceramic auxiliary layers are made of ferrite materials having substantially the same compositional system and have substantially the same crystal structure. The linear expansion coefficient of the ceramic auxiliary layers is less than the linear expansion coefficient of the ceramic base layer.

10 Claims, 2 Drawing Sheets

MULTILAYER CERAMIC ELECTRONIC COMPONENT

BACKGROUND OF THE INVENTION

1. Field of the Invention

The present invention relates to multilayer ceramic electronic components, and, in particular, to improved mechanical strength of a multilayer ceramic electronic component including a ceramic laminate made of ceramic materials, such as ferrite materials, substantially entirely made of a polycrystalline phase.

2. Description of the Related Art

Multilayer ceramic electronic components having composite multilayer structures made of magnetic materials (e.g., ferrite materials) and formed by co-firing are described in, for example, Japanese Unexamined Patent Application Publication Nos. 7-201566 and 2005-183890.

More specifically, Japanese Unexamined Patent Application Publication No. 7-201566 describes a multilayer ceramic electronic component in which low-permeability magnetic layers are stacked on upper and lower surfaces of a high-permeability magnetic layer having a coil disposed therein to prevent electrical interference between the coil and the surface conductive patterns.

Japanese Unexamined Patent Application Publication No. 2005-183890 describes a multilayer ceramic electronic component in which insulating layers are stacked on upper and lower surfaces of a magnetic layer having a coil disposed therein to increase the degree of flexibility in the arrangement of surface-mounted circuit components.

However, in the multilayer ceramic electronic component described in Japanese Unexamined Patent Application Publication No. 7-201566, it is difficult to obtain sufficient mechanical strength because the ferrite material is fundamentally brittle.

In the multilayer ceramic electronic component described in Japanese Unexamined Patent Application Publication No. 2005-183890, sufficient mechanical strength can be obtained, depending on the type of an insulating material defining the insulating layers. However, delamination, cracking, and warpage often occur because of the difference in shrinkage behavior between the magnetic layer and the insulating layers.

SUMMARY OF THE INVENTION

To overcome the problems described above, preferred embodiments of the present invention provide a multilayer ceramic electronic component including a ceramic laminate with a multilayer structure having a ceramic base layer made substantially entirely of a polycrystalline phase and at least one ceramic auxiliary layer. The ceramic base layer and the at least one ceramic auxiliary layer are formed by co-firing. The at least one ceramic auxiliary layer is arranged on at least one main surface of the ceramic base layer and is made substantially entirely of a polycrystalline phase. At least one conductive pattern is arranged inside and/or outside the ceramic laminate.

The polycrystalline phase in the ceramic base layer and the polycrystalline phase in the at least one ceramic auxiliary layer preferably have substantially the same crystal structure, and the at least one ceramic auxiliary layer preferably has a linear expansion coefficient $\alpha 2$ that is less than the linear expansion coefficient $\alpha 2$ of the ceramic base layer.

Preferred embodiments of the present invention are particularly advantageously applied when the polycrystalline phase in the ceramic base layer and the polycrystalline phase of the at least one ceramic auxiliary layer are preferably made of ferrite materials.

According to a preferred embodiment of the present invention, the ferrite material defining the ceramic base layer and the ferrite material defining the at least one ceramic auxiliary layer preferably have substantially the same compositional system. Preferably, the ferrite material defining the at least one ceramic auxiliary layer has a low permeability or is nonmagnetic. Preferably, the ferrite material is a spinel ferrite material ($MFe_2O_4$, wherein M represents a divalent metal ion) or a garnet ferrite material ($R_3Fe_5O_{12}$, wherein R represents trivalent metal ion), for example.

In the multilayer ceramic electronic component according to preferred embodiments of the present invention, preferably, the at least one conductive pattern includes a coil pattern portion arranged in the ceramic base layer.

Preferably, the at least one conductive pattern is primarily made of silver.

Preferably, the at least one ceramic auxiliary layer is further arranged in the ceramic base layer.

Preferably, the at least one ceramic auxiliary layer is substantially symmetrically arranged in the thickness direction of the ceramic laminate with respect to the approximate center of the ceramic laminate in the thickness direction.

Preferably, the difference, $\alpha 1 - \alpha 2$, between the linear expansion coefficient $\alpha 1$ of the ceramic base layer and the linear expansion coefficient $\alpha 2$ of the at least one ceramic auxiliary layer is in the range of about 0.2 ppm/° C. to about 5 ppm/° C., for example.

After an unsintered ceramic material is sintered by firing, the sintered ceramic material shrinks in proportion to the linear expansion coefficient thereof during cooling. According to preferred embodiments of the present invention, the ceramic auxiliary layer having a linear expansion coefficient less than the linear expansion coefficient of the ceramic base layer is arranged on at least one main surface of the ceramic base layer. Thus, the ceramic base layer shrinks more than the ceramic auxiliary layer. As a result, a compressive stress remains in the main surface of the multilayer ceramic electronic component on which the ceramic auxiliary layer is mounted after the completion of the cooling. Therefore, the multilayer ceramic electronic component has improved mechanical strength.

According to preferred embodiments of the present invention, the polycrystalline phase in the ceramic base layer and the polycrystalline phase of the ceramic auxiliary layer have substantially the same crystal structure. Thus, the ceramic base layer and the ceramic auxiliary layer are sintered and strongly bonded together, thereby significantly preventing the occurrence of defects, such as delamination and cracking, at the interfaces.

According to preferred embodiments of the present invention, the ceramic base layer and the ceramic auxiliary layer are made substantially entirely of the polycrystalline phases and include substantially no glass (amorphous phase). This eliminates a problem, e.g., an undesired change in properties of the ceramic materials due to the interdiffusion of the glass.

When the polycrystalline phase in the ceramic base layer and the polycrystalline phase in the ceramic auxiliary layer are both made of ferrite materials, the mechanical strength according to preferred embodiments of the present invention is further improved because the ferrite materials have fundamentally low mechanical strength.

When the ferrite material defining the ceramic base layer and the ferrite material defining the ceramic auxiliary layer have substantially the same compositional system, a change in properties caused by the interdiffusion of the components can be suppressed to a low level during the co-firing of the ceramic base layer and the ceramic auxiliary layer.

When the ferrite material defining the ceramic auxiliary layer has a low permeability or is nonmagnetic, the generation of an undesired magnetic field induced by the conductive patterns arranged on and/or in the surface of the ceramic auxiliary layer can be suppressed, thereby reducing an undesired effect on an IC chip mounted on the surface of the multilayer ceramic electronic component and the coil pattern embedded in the ceramic base layer.

When the coil pattern defining a conductive pattern is disposed in the ceramic base layer, the coil pattern can provide a large inductance value.

In the multilayer ceramic electronic component according to preferred embodiments of the present invention, when the conductive pattern is primarily made of silver, a firing step of forming a multilayer ceramic electronic component may be performed in an oxidizing atmosphere, such as air, for example.

When a ceramic auxiliary layer is also arranged in the ceramic base layer, a multilayer ceramic electronic component having a relatively large thickness dimension can have further improved mechanical strength. That is, a large thickness dimension is likely to cause internal stress due to the difference in linear expansion coefficient in a portion of the ceramic base layer spaced apart from the ceramic auxiliary layer arranged on the main surface of the ceramic base layer, which may possibly cause a reduction in strength. In contrast, the arrangement of the ceramic auxiliary layer having a relatively low linear expansion coefficient in the ceramic base layer can relieve the internal stress, thereby improving the mechanical strength of the multilayer ceramic electronic component. Furthermore, when the coil pattern is arranged in the ceramic base layer and a nonmagnetic ceramic auxiliary layer is arranged in the ceramic base layer, a coil defined by the coil pattern defines an open magnetic circuit, thus improving the properties when a DC current is superimposed. Therefore, the coil can also be used at higher current levels.

When the ceramic auxiliary layers are substantially symmetrically arranged in the thickness direction of the ceramic laminate with respect to the approximate center of the ceramic laminate in the thickness direction, this arrangement can reliably relieve the internal stress that causes a decrease in the strength of the multilayer ceramic electronic component and prevent warpage occurring in the firing step.

When the difference, α1-α2, between the linear expansion coefficient α1 of the ceramic base layer and the linear expansion coefficient α2 of the ceramic auxiliary layer is set in the range of about 0.2 ppm/° C. to about 5 ppm/° C., for example, cracks and other defects do not occur, such that the improved strength is effectively provided.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
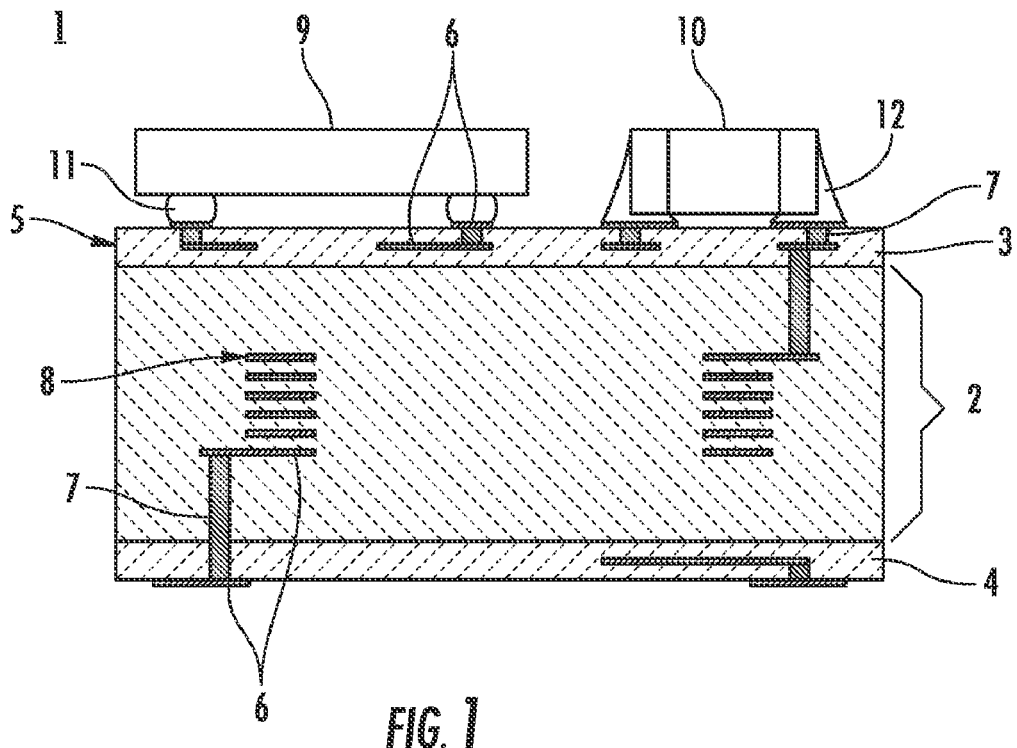
FIG. 1 is a cross-sectional view of a multilayer ceramic electronic component according to a first preferred embodiment of the present invention.

FIG. 1 is a cross-sectional view of a multilayer ceramic electronic component 1 according to a first preferred embodiment of the present invention.

The multilayer ceramic electronic component 1 includes a ceramic laminate 5 with a multilayer structure having a ceramic base layer 2 and ceramic auxiliary layers 3 and 4, the ceramic base layer 2 and the ceramic auxiliary layers 3 and 4 being formed by co-firing, and the ceramic auxiliary layers 3 and 4 being arranged on the respective upper and lower main surfaces of the ceramic base layer 2.

The multilayer ceramic electronic component 1 also includes conductive patterns arranged inside and on outer surfaces of the ceramic laminate 5. The conductive patterns are broadly divided into in-plane conductors 6 and interlayer connection conductors 7. The in-plane conductors 6 are arranged on main surfaces of stacked ceramic green sheets defining the ceramic base layer 2 or the ceramic auxiliary layer 3 or 4. The interlayer connection conductors 7 are arranged to extend through the ceramic green sheets in the thickness direction. Combinations of specific in-plane conductors 6 and specific interlayer connection conductors 7 define coil patterns 8 in the ceramic base layer 2. The interlayer connection conductors 7 defining the coil patterns 8 are not shown in FIG. 1.

The multilayer ceramic electronic component 1 defines, for example, a DC-DC converter and includes surface-mounted components 9 and 10 mounted on the upper main surface of the ceramic laminate 5. Preferably, the surface-mounted component 9 is, for example, an IC chip electrically connected to the in-plane conductors 6 arranged on the upper main surface of the ceramic laminate 5 via solder bumps 11. Preferably, the other surface-mounted component 10 is, for example, a chip capacitor electrically connected to the in-plane conductors 6 arranged on the upper main surface of the ceramic laminate 5 with solder 12. The in-plane conductors 6 arranged on the lower main surface of the ceramic laminate 5 define terminal electrodes used when the multilayer ceramic electronic component 1 is mounted on a motherboard (not shown).

The ceramic base layer 2 and the ceramic auxiliary layers 3 and 4 are made of materials which are substantially entirely made of a polycrystalline phase. The polycrystalline phase in the ceramic base layer 2 and the polycrystalline phase in the ceramic auxiliary layers 3 and 4 have substantially the same crystal structure. In addition, the ceramic auxiliary layers 3 and 4 have a linear expansion coefficient α2 that is less than the linear expansion coefficient α1 of the ceramic base layer 2.

In this preferred embodiment, the polycrystalline phase in the ceramic base layer 2 and the polycrystalline phase in the ceramic auxiliary layers 3 and 4 are made of polycrystalline phases made of ferrite materials. The ceramic base layer 2 and the ceramic auxiliary layers 3 and 4 are preferably made of ferrite materials having substantially the same compositional system. The phrase "ferrite materials having substantially the same compositional system" defined herein indicates ferrite materials having common constituent elements and different proportions of the constituent elements.

Since the ceramic base layer 2 and the ceramic auxiliary layers 3 and 4 are made of the ferrite materials having substantially the same compositional system, a change in properties due to interdiffusion of the components can be minimized during co-firing to form the ceramic base layer 2 and the ceramic auxiliary layers 3 and 4.

The ferrite material defining the ceramic auxiliary layers 3 and 4 preferably is a low-permeability (for example, about 30 or less) ferrite material or a nonmagnetic (having a permeability of about 1) ferrite material. If the ceramic auxiliary layers 3 and 4 are made of a high-permeability ferrite material, the flow of a current through a conductive pattern arranged thereon may generate an undesired magnetic field which would adversely affect the electrical properties of the IC chip defining the surface-mounted component 9 and the coil patterns 8 in the ceramic base layer 2. In contrast, the ceramic auxiliary layers 3 and 4 made of a low-permeability or nonmagnetic ferrite material suppresses the generation of an undesired magnetic field induced by the conductive patterns arranged on and/or in the ceramic auxiliary layers 3 and 4.

The ceramic base layer 2 and the ceramic auxiliary layers 3 and 4 may preferably be made of, for example, Fe—Ni—Zn—Cu-based ferrite materials.

In this case, when a mixture including ferric oxide ($Fe_2O_3$), zinc oxide (ZnO), nickel oxide (NiO), and copper oxide (CuO) in predetermined proportions is used as a material to be formed into the ferrite material defining the ceramic base layer 2, a sintered body of the material can preferably have a permeability of about 150 at 1 MHz and a linear expansion coefficient $\alpha 1$ of about 10.5, for example.

When a mixture including ferric oxide, zinc oxide, nickel oxide, and copper oxide in proportions different from those set forth above is used as a material to be formed into the ferrite material defining the ceramic auxiliary layers 3 and 4, a sintered body of the material can preferably have a permeability of about 20 at 1 MHz and a linear expansion coefficient $\alpha 2$ of about 9.5, for example.

Alternatively, when the ceramic auxiliary layers 3 and 4 are made of a nonmagnetic ferrite material, for example, an Fe—Zn—Cu-based ferrite material may be used. For example, when a mixture including ferric oxide, zinc oxide, and copper oxide in predetermined proportions is used, a sintered body of the mixture can preferably have a permeability of about 1.0 at 1 MHz and a linear expansion coefficient $\alpha 2$ of about 9.0.

In the foregoing preferred embodiments of the present invention, the Fe—Ni—Zn—Cu-based or Fe—Zn—Cu-based ferrite material is used. Alternatively, an Fe—Mn—Zn-based ferrite material may be used. These ferrite materials all have a spinel structure. Alternatively, a ferrite material having another crystal structure, such as a garnet structure, for example, may be used.

Examples of the spinel ferrite material ($MFe_2O_4$, wherein M represents a divalent metal ion) include nickel zinc ferrite $(Ni_{1-x}Zn_x)Fe_2O_4$, manganese zinc ferrite $(Mn_{1-x}Zn_x)Fe_2O_4$, nickel ferrite $NiFe_2O_4$, manganese ferrite $MnFe_2O_4$, zinc ferrite $ZnFe_2O_4$, copper ferrite $CuFe_2O_4$, cobalt ferrite $CoFe_2O_4$, magnesium ferrite $MgFe_2O_4$, lithium ferrite $(Li_{0.5}Fe_{0.5})Fe_2O_4$, γ-iron oxide (γ-$Fe_2O_3$), $Fe_{2/3}\square_{1/3}Fe_2O_4$ (wherein $\square$ represents a vacancy), and magnetite (ferrous ferrite) $Fe_3O_4$.

Examples of the garnet ferrite material ($R_3Fe_5O_{12}$, wherein R represents a trivalent metal ion) include yttrium iron garnet (YIG) $Y_3Fe_5O_{12}$ (CVG) $Ca_3Fe_{3.5}V_{1.5}O_{12}$, and gadolinium iron garnet $Gd_3Fe_5O_{12}$.

A method for producing the multilayer ceramic electronic component 1 will be described below.

Ceramic green sheets to be formed into the ceramic base layer 2 and the ceramic auxiliary layers 3 and 4 are prepared. These ceramic green sheets are provided by adding a binder, a plasticizer, a wetting agent, a dispersant, and other ingredients to the ferrite raw material powders described above to form a slurry and forming the slurry into sheets.

Through holes are formed in specific ceramic green sheets. The through holes are filled with a conductive paste to form unsintered interlayer connection conductors 7. The conductive paste is applied onto specific ceramic green sheets by printing to form unsintered in-plane conductors 6. The conductive paste for forming the in-plane conductors 6 and the interlayer connection conductors 7 preferably includes a conductive metal primarily made of silver, because such a conductive paste can be fired in an oxidizing atmosphere, such as air, for example, in a firing step described below and provide satisfactory conductivity.

Preferably, the conductive patterns except for the conductive patterns to be formed into the in-plane conductors 6 and the interlayer connection conductors 7 to define the coil patterns 8 are formed on the ceramic green sheets to be formed into the ceramic auxiliary layers 3 and 4 to the maximum extent possible.

To form the ceramic base layer 2 and the ceramic auxiliary layers 3 and 4, a predetermined number of ceramic green sheets are stacked in a predetermined order and press-bonded to form an unsintered ceramic laminate 5. When the foregoing steps are performed to form a source ceramic laminate configured to simultaneously produce a plurality of multilayer ceramic electronic components 1, grooves to facilitate the separation of the source ceramic laminate are formed.

The unsintered ceramic laminate is fired in an oxidizing atmosphere, such as air, for example, to form the sintered ceramic laminate 5.

The in-plane conductors 6 exposed at surfaces of the ceramic laminate 5 are subjected to a plating treatment. For example, electroless plating is performed to form nickel plating films and then gold plating films.

The surface-mounted component 9 and 10 are mounted on the upper main surface of the ceramic laminate 5.

When the foregoing steps are performed to the source ceramic laminate, the step of separating the source ceramic laminate along the grooves into individual multilayer ceramic electronic components 1 is performed. A metal cover, not shown, is attached to each of the multilayer ceramic electronic components 1, as required.

In the foregoing description, the grooves are preferably formed before the firing step. Alternatively, the source ceramic laminate may be separated into individual unsintered ceramic laminates 5 for the multilayer ceramic electronic components 1 before the firing step without forming grooves. In this case, the firing step is performed for each of the individual ceramic laminates 5. Preferably, for the plating treatment, electroplating, such as barrel plating, for example, is performed.

In the resulting multilayer ceramic electronic component 1 as described above, the ceramic laminate 5 shrinks in a cooling step subsequent to the firing step. The degree of shrinkage is proportional to the linear expansion coefficient of the ceramic material. In this preferred embodiment, the linear expansion coefficient $\alpha 2$ of the ceramic auxiliary layers 3 and 4 is less than the linear expansion coefficient $\alpha 1$ of the ceramic base layer 2. Thus, the ceramic base layer 2 shrinks to a greater extent. As a result, compressive stresses remain in both main surfaces of the ceramic laminate 5 after the completion of cooling. Therefore, the ceramic laminate 5, and thus, the multilayer ceramic electronic component 1 have improved mechanical strength.

The difference in linear expansion coefficient between the ceramic auxiliary layers 3 and 4 and the ceramic base layer 2 may cause delamination and cracks. However, in this preferred embodiment, the ceramic auxiliary layers 3 and 4 and the ceramic base layer 2 are made of the ceramic materials having substantially the same crystal structure. Thus, the ceramic auxiliary layers 3 and 4 and the ceramic base layer 2 are strongly bonded to each other by sintering the ceramic materials, thereby preventing the occurrence of defects, such as delamination and cracks described above.

The ceramic auxiliary layers 3 and 4 and the ceramic base layer 2 are made substantially entirely of the polycrystalline phases and include substantially no diffusive component, such as glass (amorphous phase), for example. Thus, an undesired change in composition caused by diffusion does not easily occur, thereby providing the ceramic laminate 5 with high reliability.

The difference $\alpha 1-\alpha 2$ between the linear expansion coefficient $\alpha 1$ of the ceramic base layer 2 and the linear expansion coefficient $\alpha 2$ of the ceramic auxiliary layers 3 and 4 is preferably in the range of about 0.2 ppm/° C. to about 5 ppm/° C., for example. This is also true for the above-described specific examples of the ferrite materials defining the ceramic base layer 2 and the ceramic auxiliary layers 3 and 4. A difference of less than about 0.2 ppm/° C. results in a reduced improvement in strength. A difference exceeding about 5 ppm/° C. is likely to cause defects, such as the formation of cracks, in the ceramic laminate 5. The difference $\alpha 1-\alpha 2$ of the linear expansion coefficients is more preferably in the range of about 0.4 ppm/° C. to 3 about ppm/° C., for example. In this case, the multilayer ceramic electronic component 1 having improved strength can be more reliably produced.

Each of the ceramic auxiliary layers 3 and 4 preferably has a thickness of about 5 μm to about 300 μm, for example. When each of the ceramic auxiliary layers 3 and 4 has a thickness of less than about 5 μm, cracks easily form in the ceramic auxiliary layers 3 and 4 during cooling subsequent to firing. At a thickness exceeding about 300 μm, compressive stresses caused by the difference in linear expansion coefficient therebetween do not easily affect the surfaces of the ceramic laminate 5, thus not sufficiently providing improved strength.

Figure 2:
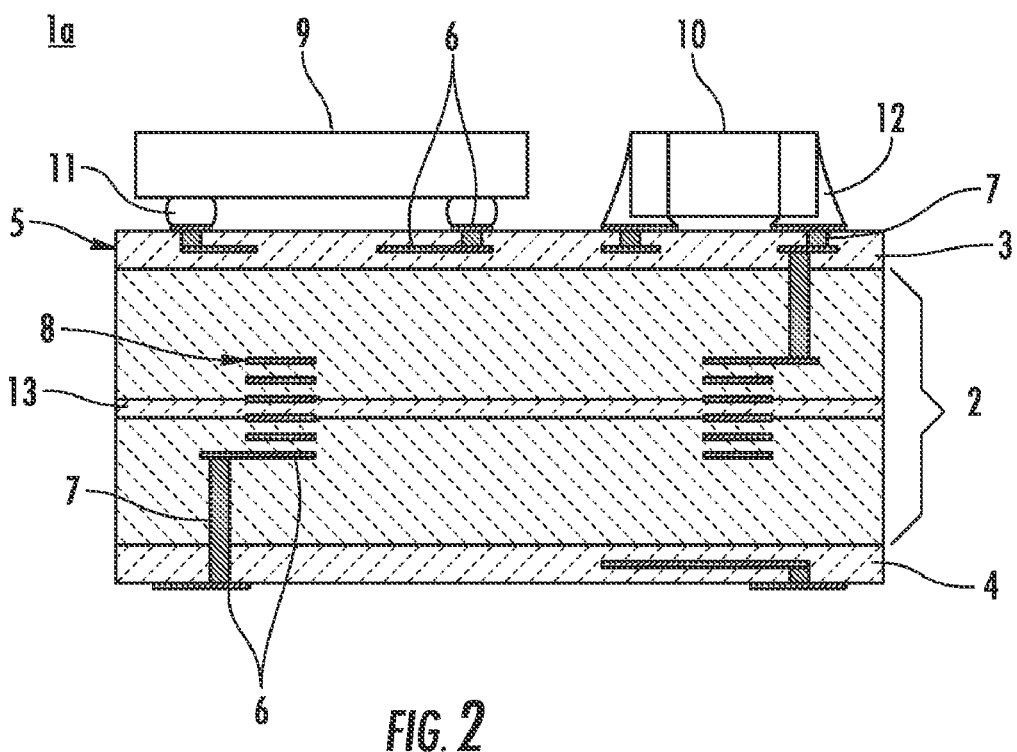
FIG. 2 is a cross-sectional view of a multilayer ceramic electronic component according to a second preferred embodiment of the present invention.
Figure 3:
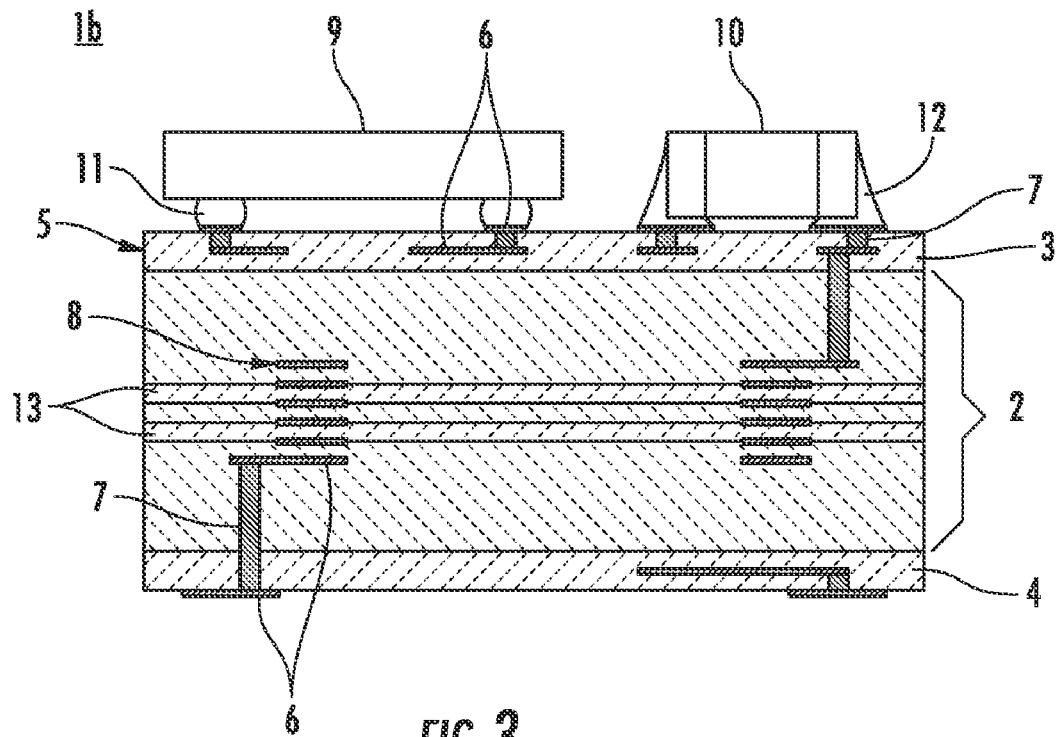
FIG. 3 is a cross-sectional view of a multilayer ceramic electronic component according to a third preferred embodiment of the present invention.

FIGS. 2 and 3 show multilayer ceramic electronic components 1a and 1b according to second and third preferred embodiments of the present invention, respectively, and each correspond to FIG. 1. In FIGS. 2 and 3, elements that are equivalent to those shown in FIG. 1 are designated by the same reference numerals, and descriptions thereof are omitted.

The multilayer ceramic electronic component 1a shown in FIG. 2 includes a ceramic auxiliary layer 13 arranged in the ceramic base layer 2 as well as the ceramic auxiliary layers 3 and 4 arranged on the main surfaces of the ceramic base layer 2. The multilayer ceramic electronic component 1b shown in FIG. 3 includes a plurality of the ceramic auxiliary layers 13, for example, two ceramic auxiliary layers 13.

The ceramic auxiliary layer 13 provides the following effects and advantages.

When the ceramic base layer 2 has a large thickness dimension, in particular, a thickness dimension of at least about 500 μm, defects, such as cracks, may form in the ceramic base layer 2. In the ceramic base layer 2 having a relatively high linear expansion coefficient and the main surfaces fixed by the ceramic auxiliary layers 3 and 4 having a relatively low linear expansion coefficient, a shrinkage force is generated inside the ceramic base layer 2. When the ceramic base layer 2 has a thickness of, for example, less than about 500 μm, the internal stress is not sufficient to reduce the strength of the ceramic base layer 2. However, the middle portion of the ceramic base layer 2 in the thickness direction tends to shrink as the thickness of the ceramic base layer 2 increases. The internal tensile stress is applied in the planar direction between the surface portions and the approximate middle portion of the ceramic base layer 2, thereby easily causing cracks in side surfaces at or near the intermediate portions between the surface portions and the approximate middle portion.

Accordingly, the arrangement of the ceramic auxiliary layer 13 having a relatively low linear expansion coefficient in the ceramic base layer 2 can relieve excessive internal shrinkage stresses in the ceramic base layer 2. Thereby, the arrangement of the ceramic auxiliary layer 13 therein provide sufficient mechanical strength even when the ceramic laminate 5 has a relatively large thickness dimension, in particular, even when the ceramic base layer 2 has a relatively large thickness dimension.

When the ceramic auxiliary layer 13 is arranged in the ceramic base layer 2 such that the continuous thickness of the ceramic base layer 2 is about 300 μm or less and preferably about 200 μm or less, the improved strength can be effectively provided, and the ceramic laminate 5 can be more stably produced.

Furthermore, the arrangement of the ceramic auxiliary layer 13 further improves the mechanical strength even when the ceramic base layer 2 has a thickness of about 500 μm or less.

The ceramic auxiliary layer 13 preferably has a thickness of at least about 5 μm. This is because at a thickness of less than about 5 μm, the internal stress generated in the ceramic base layer 2 is not sufficiently relieved by the ceramic auxiliary layer 13.

The ceramic auxiliary layer 13 is made of substantially the same material as the ceramic auxiliary layers 3 and 4. For example, any combination of the ceramic auxiliary layers 3 and 4 and the ceramic auxiliary layer 13, for example, a combination of the ceramic auxiliary layers 3 and 4 made of a low-permeability ferrite material and the ceramic auxiliary layer 13 made of a nonmagnetic ferrite material, may be used. In this case, the selection of the materials having the optimum permeability and linear expansion coefficient provides the multilayer ceramic electronic components 1a and 1b having outstanding electrical properties and mechanical strength.

FIGS. 2 and 3 clearly show that the ceramic auxiliary layers 3 and 4 and the ceramic auxiliary layers 13 are substantially symmetrically arranged in the thickness direction of the ceramic laminate 5 with respect to the approximate center of the ceramic laminate 5 in the thickness direction. This arrangement reliably relieves the internal stress that causes a decrease in the strength of the ceramic laminate 5 and prevents warpage in the firing step. The ceramic auxiliary layers 3 and 4 are substantially symmetrically arranged in the thickness direction of the ceramic laminate 5 in the multilayer ceramic electronic component 1 shown in FIG. 1, thus providing an effect that is similar to the effect described above.

As shown in FIGS. 2 and 3, preferably, the ceramic auxiliary layers 13 in the ceramic base layer 2 extends to end surfaces of the ceramic laminate 5. This effectively relieves the internal stress in the vicinity of the end surfaces of the ceramic base layer 2, so as to prevent cracks beginning at the end surfaces of the ceramic laminate 5.

As shown in FIGS. 2 and 3, the ceramic auxiliary layers 13 are preferably arranged at a portion in which the coil patterns 8 are arranged when the ceramic auxiliary layers 13 are made of a nonmagnetic material. In this case, coils defined by the coil patterns 8 provide open magnetic circuits, and thus, are not easily magnetically saturated, thus improving the properties when a DC current is superimposed. Therefore, the multilayer ceramic electronic components 1a and 1b can also be used at higher current levels.

The preferred embodiments of the present invention shown in FIGS. 1 to 3 have been described above. However, various changes may be made within the scope of the invention.

For example, preferably, the ceramic auxiliary layers 3 and 4 and the ceramic auxiliary layer 13 are arranged to extend substantially entirely over the surfaces of the multilayer ceramic electronic components 1, 1a, and 1b in the planar direction. Alternatively, the ceramic auxiliary layers 3 and 4 and the ceramic auxiliary layer 13 may not extend substantially entirely over the surfaces of the multilayer ceramic electronic components 1, 1a, and 1b, as long as the foregoing advantages are obtained. For example, regions, such as a notch and a hole, which are not covered with the layers, may be provided.

The multilayer ceramic electronic components 1, 1a, and 1b shown in FIGS. 1 to 3 are multi-function composite components including the surface-mounted components 9 and 10 mounted on the ceramic laminates 5. Alternatively, preferred embodiments of the present invention can also be applied to, for example, a chip inductor as shown in FIG. 4.

Figure 4:
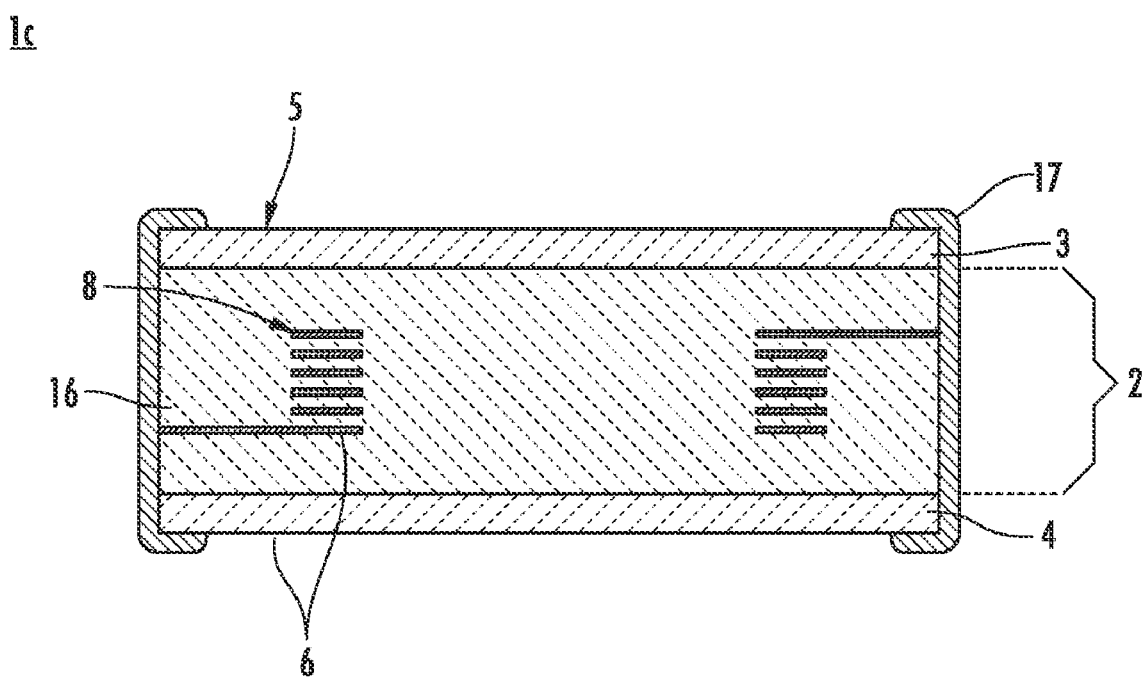
FIG. 4 is a cross-sectional view of a multilayer ceramic electronic component according to a fourth preferred embodiment of the present invention.

FIG. 4 is a cross-sectional view of a multilayer ceramic electronic component 1c defining a chip inductor according to a fourth preferred embodiment of the present invention. In FIG. 4, elements that are equivalent to those shown in FIG. 1 are designated by the same reference numerals, and descriptions thereof are omitted.

In the multilayer ceramic electronic component 1c defining a chip inductor shown in FIG. 4, terminal conductors 16 and 17 are arranged on both end surfaces of the ceramic laminate 5. Each of the end portions of the coil patterns 8 extends to a corresponding one of the end surfaces of the ceramic laminate 5 and is electrically connected to a corresponding one of the terminal conductors 16 and 17.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A multilayer ceramic electronic component comprising:
a ceramic laminate having a multilayer structure including a ceramic base layer made substantially entirely of a polycrystalline phase with no amorphous phase and at least one ceramic auxiliary layer, the ceramic base layer and the at least one ceramic auxiliary layers being co-fired, the at least one ceramic auxiliary layer being arranged on at least one main surface of the ceramic base layer and being made substantially entirely of a polycrystalline phase; and
at least one conductive pattern arranged inside or on an outer surface of the ceramic laminate; wherein
the polycrystalline phase in the ceramic base layer and the polycrystalline phase in the at least one ceramic auxiliary layer have substantially the same crystal structure; and
the at least one ceramic auxiliary layer has a linear expansion coefficient $\alpha 2$ that is less than the linear expansion coefficient $\alpha 1$ of the ceramic base layer.

2. The multilayer ceramic electronic component according to claim 1, wherein the polycrystalline phase in the ceramic base layer and the polycrystalline phase of the at least one ceramic auxiliary layer are made of ferrite materials.

3. The multilayer ceramic electronic component according to claim 1, wherein the at least one conductive pattern is primarily made of silver.

4. The multilayer ceramic electronic component according to claim 1, wherein the at least one ceramic auxiliary layer is arranged in the ceramic base layer.

5. The multilayer ceramic electronic component according to claim 1, wherein the at least one ceramic auxiliary layer is substantially symmetrically arranged in a thickness direction of the ceramic laminate with respect to an approximate center of the ceramic laminate in the thickness direction.

6. The multilayer ceramic electronic component according to claim 2, wherein the ferrite material defining the ceramic base layer and the ferrite material defining the at least one ceramic auxiliary layer have substantially the same compositional system.

7. The multilayer ceramic electronic component according to claim 2, wherein the ferrite material defining the at least one ceramic auxiliary layer has a low permeability or is nonmagnetic.

8. The multilayer ceramic electronic component according to claim 2, wherein the ferrite material is a spinel ferrite material of $MFe_2O_4$, where M represents a divalent metal ion, or a garnet ferrite material of $R_3Fe_5O_{12}$, where R represents trivalent metal ion.

9. The multilayer ceramic electronic component according to claim 2, wherein the at least one conductive pattern includes a coil pattern portion arranged in the ceramic base layer.

10. A multilayer ceramic electronic component comprising:
a ceramic laminate having a multilayer structure including a ceramic base layer made substantially entirely of a polycrystalline phase and at least one ceramic auxiliary layer, the ceramic base layer and the at least one ceramic auxiliary layers being co-fired, the at least one ceramic auxiliary layer being arranged on at least one main surface of the ceramic base layer and being made substantially entirely of a polycrystalline phase; and
at least one conductive pattern arranged inside or on an outer surface of the ceramic laminate; wherein
the polycrystalline phase in the ceramic base layer and the polycrystalline phase in the at least one ceramic auxiliary layer have substantially the same crystal structure; and
the at least one ceramic auxiliary layer has a linear expansion coefficient $\alpha 2$ that is less than the linear expansion coefficient $\alpha 1$ of the ceramic base layer,
wherein a difference, $\alpha 1$-$\alpha 2$, between the linear expansion coefficient $\alpha 1$ of the ceramic base layer and the linear expansion coefficient $\alpha 2$ of the at least one ceramic auxiliary layer is in the range of about 0.2 ppm/° C. to about 5 ppm/° C.

* * * * *